United States Patent
Kokusho

(10) Patent No.: US 9,462,711 B2
(45) Date of Patent: Oct. 4, 2016

(54) DISPLAY DEVICE MOUNTED IN HOUSING WITH ELASTIC BODY

(71) Applicant: MITSUBISHI ELECTRIC CORPORATION, Tokyo (JP)

(72) Inventor: Takafumi Kokusho, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 258 days.

(21) Appl. No.: 13/931,160

(22) Filed: Jun. 28, 2013

(65) Prior Publication Data

US 2014/0009910 A1 Jan. 9, 2014

(30) Foreign Application Priority Data

Jul. 5, 2012 (JP) .................. 2012-151346

(51) Int. Cl.
| | |
|---|---|
| *H05K 5/02* | (2006.01) |
| *H05K 5/00* | (2006.01) |
| *F21V 33/00* | (2006.01) |
| *G06F 1/16* | (2006.01) |
| *G02F 1/1333* | (2006.01) |

(52) U.S. Cl.
CPC ......... *H05K 5/0217* (2013.01); *F21V 33/0052* (2013.01); *G02F 1/1333* (2013.01); *G06F 1/1637* (2013.01); *H05K 5/0017* (2013.01)

(58) Field of Classification Search
CPC ............ F21V 33/0052; H05K 5/0217; H05K 5/0017; G02F 1/133308; G02F 2001/133325; G02F 1/1333; G06F 1/1637
USPC .................. 349/58, 60; 362/97.1; 361/679.01
See application file for complete search history.

(56) References Cited

U.S. PATENT DOCUMENTS

| 5,808,707 A * | 9/1998 | Niibori ............. G02F 1/133308 |
| | | 349/150 |
| 7,327,414 B2 * | 2/2008 | Won et al. ...................... 349/58 |
| 7,492,421 B1 | 2/2009 | Kim et al. |
| 7,710,509 B2 | 5/2010 | Asano et al. |
| 2004/0042172 A1 * | 3/2004 | Kusaka ................. G06F 1/1616 |
| | | 361/679.53 |
| 2009/0290294 A1 * | 11/2009 | Prest ........................ 361/679.01 |
| 2011/0291955 A1 * | 12/2011 | Tang et al. .................... 345/173 |

FOREIGN PATENT DOCUMENTS

| JP | S61-53793 U | 4/1986 |
| JP | H06-21018 U | 3/1994 |
| JP | H10-107454 A | 4/1998 |
| JP | 11-305684 A | 11/1999 |
| JP | 2000-214457 A | 8/2000 |
| JP | 2001-345901 A | 12/2001 |

(Continued)

OTHER PUBLICATIONS

An Office Action; "Notification of Reason(s) for Refusal," issued by the Japanese Patent Office on Feb. 16, 2016, which corresponds to Japanese Patent Application No. 2012-151346 and is related to U.S. Appl. No. 13/931,160; with English language partial translation.

*Primary Examiner* — Karabi Guharay
(74) *Attorney, Agent, or Firm* — Studebaker & Brackett PC

(57) ABSTRACT

A recessed portion is formed in a side face of a display device. An elastic body is provided in a recessed portion. The elastic body is elastically deformed to fix the display device to a housing when the display device is mounted in a predetermined-shaped space of the housing.

6 Claims, 13 Drawing Sheets

(56) References Cited

FOREIGN PATENT DOCUMENTS

| JP | 2002-365613 A | 12/2002 |
| JP | 2003-140115 A | 5/2003 |
| JP | 2003-195264 A | 7/2003 |
| JP | 2009-058915 A | 3/2009 |

* cited by examiner

F I G. 3
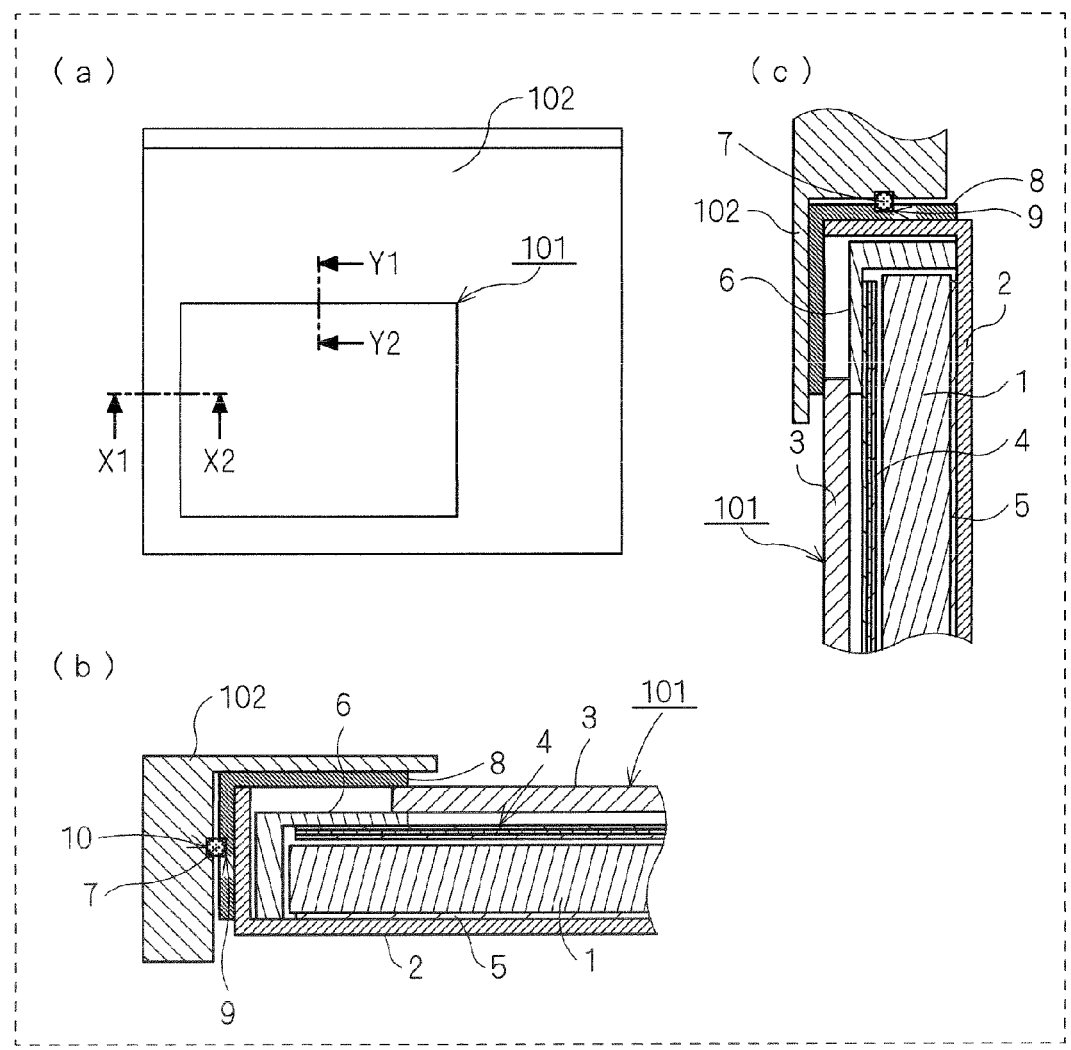

F I G . 1 2
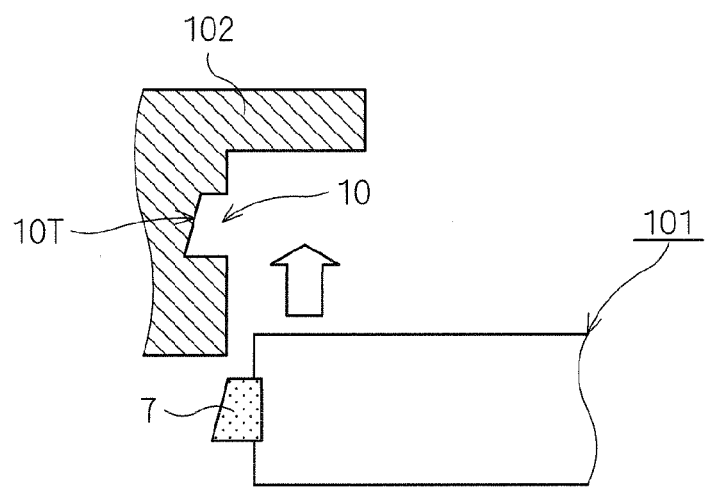
F I G . 1 3
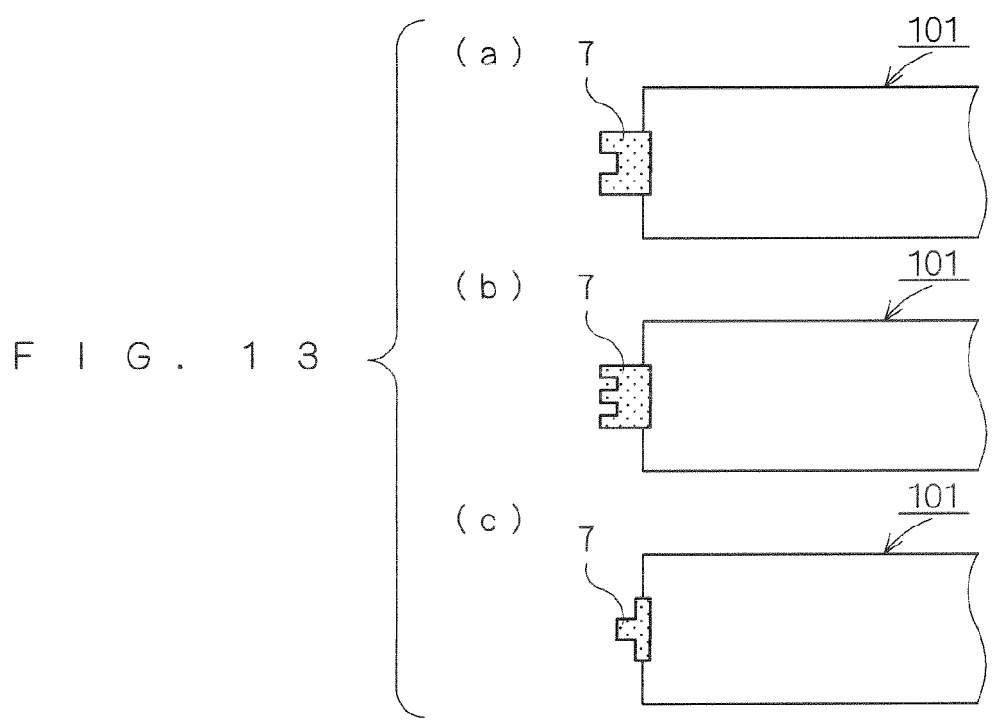

DISPLAY DEVICE MOUNTED IN HOUSING WITH ELASTIC BODY

BACKGROUND OF THE INVENTION

1. Field of the Invention

The present invention relates to a display device to be mounted to a housing.

2. Description of the Background Art

A general display device is fixed to a housing by being fastened by screws or by being held by metal flat springs. Therefore, the display device has screw holes for fixing or a portion to be held by the housing (see Japanese Patent Application Laid-Open No. 11-305684 (1999) and Japanese Patent Application Laid-Open No. 2009-058915).

Among conventional structures in which the display device is mounted to the housing, there are a structure in which a housing and a display device are fastened to each other by using screws, a structure in which a display device is held by portions such as metal flat springs provided to the housing for retaining the display device, and the like. Moreover, there is a structure in which the display device is fixed by being attached to the housing by using double-faced adhesive tape.

In the structure in which the display device is fixed by the screws, the display device needs to have screw insertion portions. Therefore, in order to provide the screw insertion portions, certain or greater frame width and thickness of the display device are required. Moreover, in this structure, screw driving work is required to fix the display device and it takes time to mount the display device. As a result, labor cost and the like increase, which leads to high cost.

In the structure in which the display device is retained by the portions such as metal flat springs provided to the housing for retaining the display device, parts such as a circuit board cannot be disposed in areas of a back face of the display device to be retained. Furthermore, in the conventional structure using the metal flat springs, a display face side and the back face side of the display device are held by the housing, and therefore the display device needs to have such a structure as to be able to bear stress. In other words, the structure using the metal flat springs is complicated, which increases cost for fixing the display device.

In the structure in which the display device is fixed by using the double-faced adhesive tape, the number of parts required for mounting increases. Moreover, if the display device is detached from the housing in this structure, the double-faced adhesive tape is difficult to reuse and it is necessary to prepare new members. Because of use of the double-faced adhesive tape, it takes time to mount the display device. As a result, labor costs and the like increase, which leads to high cost.

SUMMARY OF THE INVENTION

It is an object of the present invention to provide a display device which can be mounted to a housing at low cost.

A display device according to an aspect of the present invention is a display device mounted in a predetermined-shaped space of a housing. A recessed portion is formed in a side face of the display device. An elastic body is provided in the recessed portion. The elastic body is elastically deformed to fix the display device to the housing when the display device is mounted in the space of the housing.

According to the present invention, the recessed portion is formed in the side face of the display device. The elastic body is provided in the recessed portion. The elastic body is elastically deformed to fix the display device to the housing when the display device is mounted in the space of the housing.

In this way, it is possible to mount the display device to the housing with a simple structure utilizing the elastic body. As a result, it is possible to mount the display device to the housing at low cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a detail view of structures of the display device and the housing;

FIG. 12 is a view showing a tapered recessed portion of the housing;

FIG. 13 is a view showing examples of a sectional shape of the elastic body;

DESCRIPTION OF THE PREFERRED EMBODIMENTS

Figure 1:
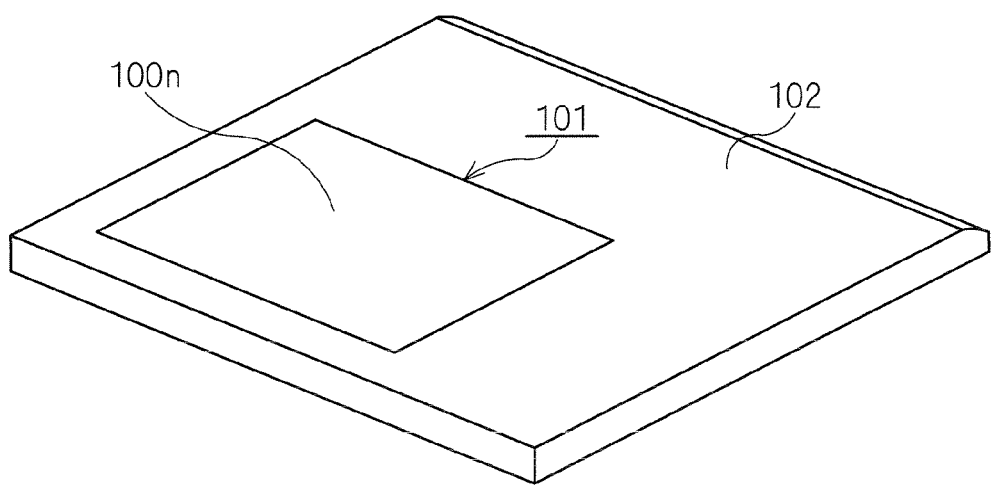
FIG. 1 is a perspective view of a display device and a housing according to a first preferred embodiment of the present invention.

Preferred embodiments of the present invention will be described below with reference to the drawings. In the following description, the same components are provided with the same reference numerals, and names and functions thereof are also the same. Therefore, detailed description thereof may be omitted in some cases.

Dimensions, materials, shapes, and relative positions of respective components shown as examples in the preferred embodiments are changed suitably depending on a structure of an apparatus to which the present invention is applied and various conditions and the present invention is not restricted to the examples. The dimensions of the respective components in the respective drawings may be different from actual dimensions.

First Preferred Embodiment

Structure of Display Device (Planar Light Source Device)

Figure 2:
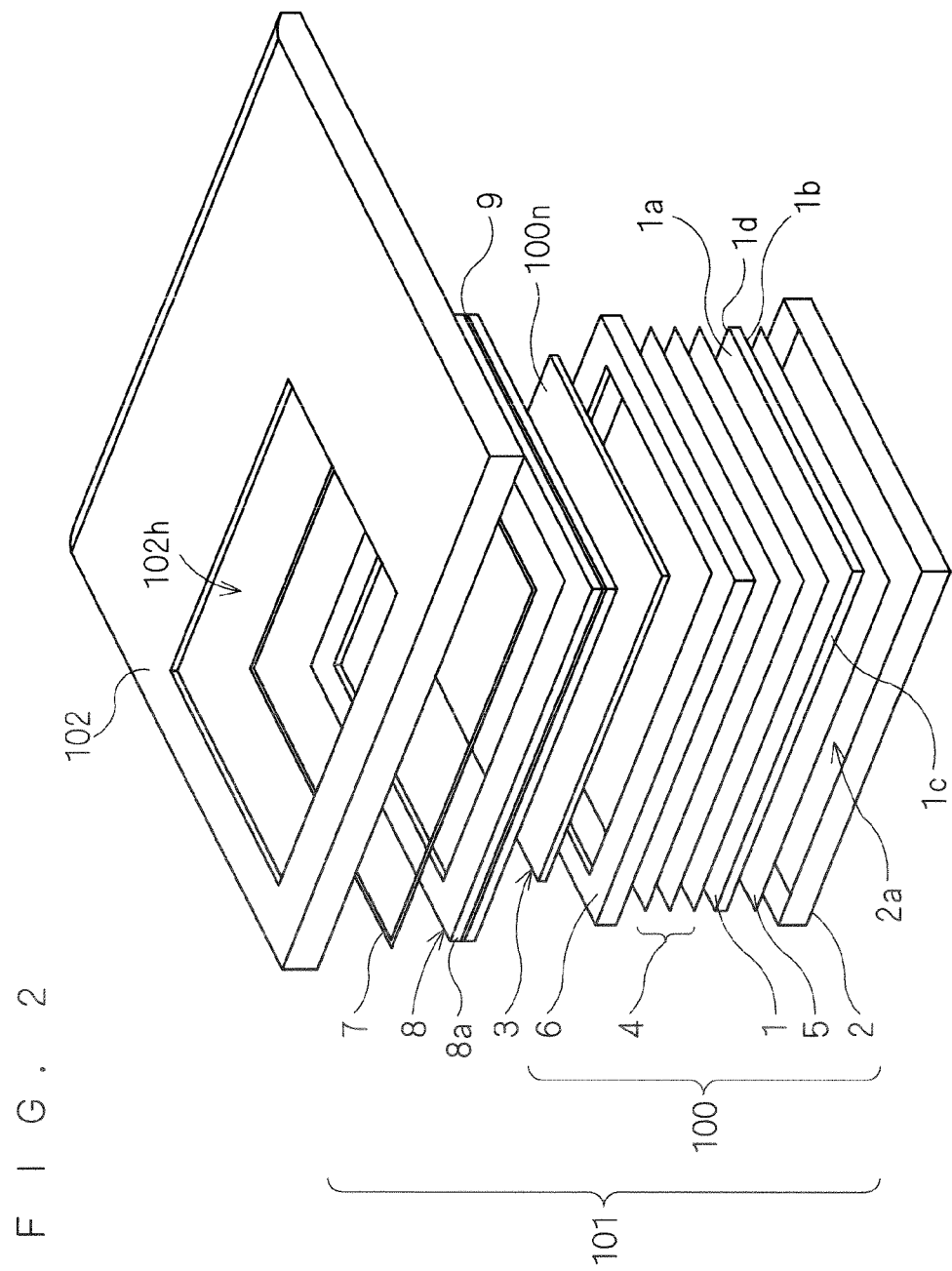
FIG. 2 is an exploded perspective view of the display device and the housing according to the first preferred embodiment of the present invention.

FIG. 1 is a perspective view of a display device 101 and a housing 102 according to a first preferred embodiment of the present invention. FIG. 1 shows the display device 101 mounted to the housing 102. FIG. 2 is an exploded perspective view of the display device 101 and the housing 102 according to the first preferred embodiment of the present invention.

With reference to FIGS. 1 and 2, the housing 102 has an opening portion 102h. The display device 101 is a device to be mounted to the housing 102. More specifically, the display device 101 is mounted in a predetermined-shaped space (described later) of the housing 102. The display device 101 has a shape of a flat plate. The display device 101 is not limited to the flat plate shape but may have other shapes.

The display device 101 has a display surface 100n for displaying video images. The display surface 100n of the display device 101 mounted to the housing 102 is adjacent to one face of the housing 102. In the following description, the face of the housing 102 adjacent to the display surface 100n of the display device 101 mounted to the housing 102 will be referred to as "housing front face". A face of the housing 102 on an opposite side from the housing front face will be referred to as "housing back face".

The display device 101 includes a display panel 3, an elastic body 7, a front frame 8, and a planar light source device 100. Details of the display panel 3, the elastic body 7, and the front frame 8 will be described later. The display panel 3 and the elastic body 7 will be briefly described below.

The display panel 3 is placed on the planar light source device 100. The display panel 3 displays the video images by utilizing light emitted from the planar light source device 100. The display panel 3 is a liquid crystal display panel, for example. The display panel 3 has the display surface 100n for displaying the video images.

The elastic body 7 has elasticity. The elastic body 7 has a closed loop shape.

The planar light source device 100 is a light source for emitting light. The planar light source device 100 includes a light guide plate 1, a rear frame 2, a group of optical sheets 4, a reflection sheet 5, and an intermediate frame 6.

The light guide plate 1 has a flat plate shape. The light guide plate 1 has a rectangular shape. The light guide plate 1 has an emitting surface 1a, an opposite emitting surface 1b, a side face 1c, and a side face 1d. The emitting surface 1a is a surface for emitting light. The opposite emitting surface 1b is a surface opposite to the emitting surface 1a.

The side face 1c and the side face 1d face each other. The side face 1c and the side face 1d are surfaces substantially perpendicular to the emitting surface 1a and the opposite emitting surface 1b. The side face 1c and the side face 1d are surfaces connecting the emitting surface 1a and the opposite emitting surface 1b. A point light source (not shown) for emitting light is disposed on one of the side face 1c and the side face 1d.

The light guide plate 1 guides the light in a planar shape and emits the light from the emitting surface 1a. The light guide plate 1 emits the light toward an opening portion 2a. In the following description, a direction in which the light guide plate 1 emits the light will be referred to as "emitting direction".

The rear frame 2 has the opening portion 2a. The light guide plate 1 is provided in the opening portion 2a of the rear frame 2. The group of optical sheets 4 is provided on the emitting surface 1a side of the light guide plate 1. The group of optical sheets 4 includes a lens sheet, a diffusion sheet for diffusing light, and the like. The reflection sheet 5 is provided on the opposite emitting surface 1b side of the light guide plate 1.

The intermediate frame 6 is made of resin material, metal material, or the like. The intermediate frame 6 is provided to face the rear frame 2. The light guide plate 1 and the group of optical sheets 4 are sandwiched between the intermediate frame 6 and the rear frame 2.

The display panel 3 is retained by the intermediate frame 6. The intermediate frame 6 for retaining the display panel 3 is sandwiched between the front frame 8 and the planar light source device 100. The front frame 8 holds the display panel 3 placed on the planar light source device 100.

FIG. 3 is a detail view of structures of the display device 101 and the housing 102. Part (a) in FIG. 3 is a plan view of the display device 101 and the housing 102. Part (b) in FIG. 3 is a sectional view of the display device 101 and the housing 102 taken along line X1-X2 in part (a) in FIG. 3. Part (c) in FIG. 3 is a sectional view of the display device 101 and the housing 102 taken along line Y1-Y2 in part (a) in FIG. 3.

With reference to FIG. 2 and parts (b) and (c) in FIG. 3, the front frame 8 forms a side face of the display device 101. That is, the side face of the display device 101 is a side face 8a of the front frame 8. In the side face 8a of the front frame 8, a recessed portion 9 (groove) is formed. That is, the recessed portion 9 is formed in the side face of the display device 101. A bottom of the recessed portion 9 is a flat face. In the recessed portion 9, a part of the elastic body 7 is housed. That is, the elastic body 7 is provided in the recessed portion 9. The elastic body 7 is provided so as to make contact with the bottom of the recessed portion 9.

A part of the elastic body 7 is exposed from the recessed portion 9. In this way, as shown in FIG. 4, on the side face of the display device 101, the elastic body 7 is provided in a closed loop shape.

Figure 4:
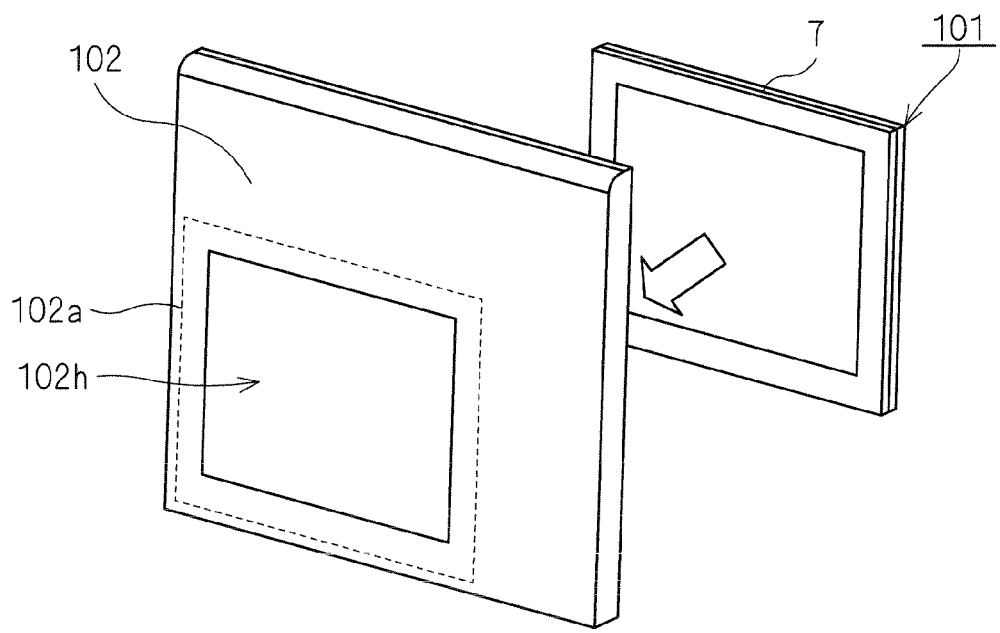
FIG. 4 is a perspective view of the display device and the housing seen from a front face side of the housing.

As shown in FIG. 4, when the display device 101 is mounted (fixed) to the housing 102, stress acts on the display device 101 and the housing 102 due to elastic deformation of the elastic body 7. As a result, the display device 101 is fixed to the housing 102.

Next, the respective components will be described in detail.

(Reflection Sheet)

The reflection sheet 5 is made of material prepared by mixing barium sulfate or titanium oxide into polyethylene or polyethylene terephthalate. The reflection sheet 5 is not restricted thereto, and may be made of material prepared by forming minute air bubbles in resin, material prepared by evaporating silver on a metal sheet, material prepared by applying paint including titanium oxide on a metal sheet, or the like.

A reflection rate of the reflection sheet 5 is preferably 90% or higher in order to suppress a reflection loss on the reflection surface. For this purpose, the reflection sheet 5 may be made of mirror reflective material.

The reflection sheet 5 can reflect the light emitted from the light guide plate 1, direct the light toward the light guide plate 1 again, and cause the light to enter the light guide plate 1. Therefore, it is possible to improve light use efficiency.

(Rear Frame)

The rear frame 2 has a point light source (not shown) for emitting light. In the structure in which the point light source is used as a light source, the rear frame 2 is made of metal material such as aluminum. In this way, it is possible to further enhance heat radiation property of the point light source. As a result, it is possible to suppress a loss of light to thereby improve light use efficiency of the planar light source device 100.

(Optical Sheet)

The group of optical sheets 4 is formed by combining the lens sheet, the diffusion sheet, and the like. The group of optical sheets 4 is not restricted to the structure described above. For example, the group of optical sheets 4 may have a structure in which a lens sheet is sandwiched between diffusion sheets. The group of optical sheets 4 may be formed by using a plurality of lens sheets with an optimum combination of directions of prisms in order to increase brightness. The group of optical sheets 4 may be formed by using two or more diffusion sheets in order to enhance diffusion property of the diffusion sheet. The group of optical sheets 4 may be formed by using a single diffusion sheet or may be formed without a diffusion sheet. The group of optical sheets 4 may be formed by using a protecting sheet, a viewing angle control sheet, and a polarizing reflection sheet. That is, the group of optical sheets 4 may be formed according to required brightness, light distribution characteristics, and the like.

(Display Panel)

The display device 101 is formed by disposing the display panel 3 on the planar light source device 100. The display panel 3 is a liquid crystal display panel formed by utilizing a birefringence property of liquid crystal material. The display panel 3 is not restricted to the liquid crystal display panel, and may be a display panel having a transparent plate on which letters and pictures are printed.

In the liquid crystal display panel, a color filter substrate and a TFT substrate are disposed to face each other. On the color filter substrate, a color filter, a light shielding layer, a counter electrode, and the like are formed. On the TFT substrate, thin film transistors (hereinafter referred to as "TFT") serving as switching elements, pixel electrodes, and the like are formed.

The liquid crystal display panel includes a spacer, sealing material, a liquid crystal layer, an orientation film, and a polarizing plate. The spacer is a member for maintaining a clearance between the color filter substrate and the TFT substrate. The sealing material is for attaching the color filter substrate and the TFT substrate on each other. The liquid crystal layer is sandwiched between the color filter substrate and the TFT substrate. The orientation film orients liquid crystal in the liquid crystal layer.

The liquid crystal display panel controls orientation of the liquid crystal in the liquid crystal layer by turning on and off of voltage by the switching elements, and modulates light entering the liquid crystal display panel according to video signals. In this way, the liquid crystal display panel carries out video image display.

(Light Guide Plate)

In the present preferred embodiment, the light guide plate 1 has the flat plate shape with a constant thickness. The light guide plate 1 may have a wedge shape, for example. The light guide plate 1 is made of material such as transparent acrylic resin, polycarbonate resin, and glass.

On the opposite emitting surface 1b side of the light guide plate 1, a light scattering portion (not shown) is formed. The light scattering portion disturbs a direction of propagation of the light and guides the light to a direction in which the light is to be emitted from the emitting surface 1a. The light scattering portion functions as reflecting means for reflecting the light toward an inside of the light guide plate 1. The reflecting means may be achieved by providing dot printing onto the opposite emitting surface 1b, forming a grained surface by roughening the opposite emitting surface 1b, or by forming minute spherical surfaces and asperities.

(Front Frame)

The front frame 8 has an opening portion so that the display surface 100n of the display panel 3 is visible from outside. The front frame 8 has the side face 8a. The side face 8a is an outer peripheral side face perpendicular to the opening portion on the display surface 100n side. In the side face 8a of the front frame 8 in the present preferred embodiment, the recessed portion 9 is formed. The recessed portion 9 is recessed toward an inside of the display device 101.

The front frame 8 is made of metal material such as aluminum. By using the metal material for the front frame 8, rigidity of the display device 101 increases.

(Planar Light Source Device)

The planar light source device 100 is formed by sandwiching, between the rear frame 2 and the intermediate frame 6, the group of optical sheets 4, the light guide plate 1, the reflection sheet 5, and the light source (not shown).

(Elastic Body)

The elastic body 7 has such elasticity as to be deformed when a load is applied thereto and to return to its original state when the load is removed therefrom. The elastic body 7 is disposed between the display device 101 and the housing 102 to thereby fix the display device 101 and the housing 102 to each other.

The elastic body 7 is rubber, for example. Examples of material of the elastic body 7 include silicon. The material is suitably selected according to a sectional shape of the elastic body and a clearance between the display device 101 and the housing 102.

Stress generated between the display device 101 and the housing 102 can be expressed by the following expression 1. The stress can be adjusted according to the material or shape of the elastic body 7. The material and the sectional shape of the elastic body 7 can be suitably and freely selected according to size and weight of the display device 101.

$$\sigma = E \times \epsilon \text{(Stress=Elastic modulus} \times \text{Strain)} \quad \text{(Expression 1)}$$

Figure 5:
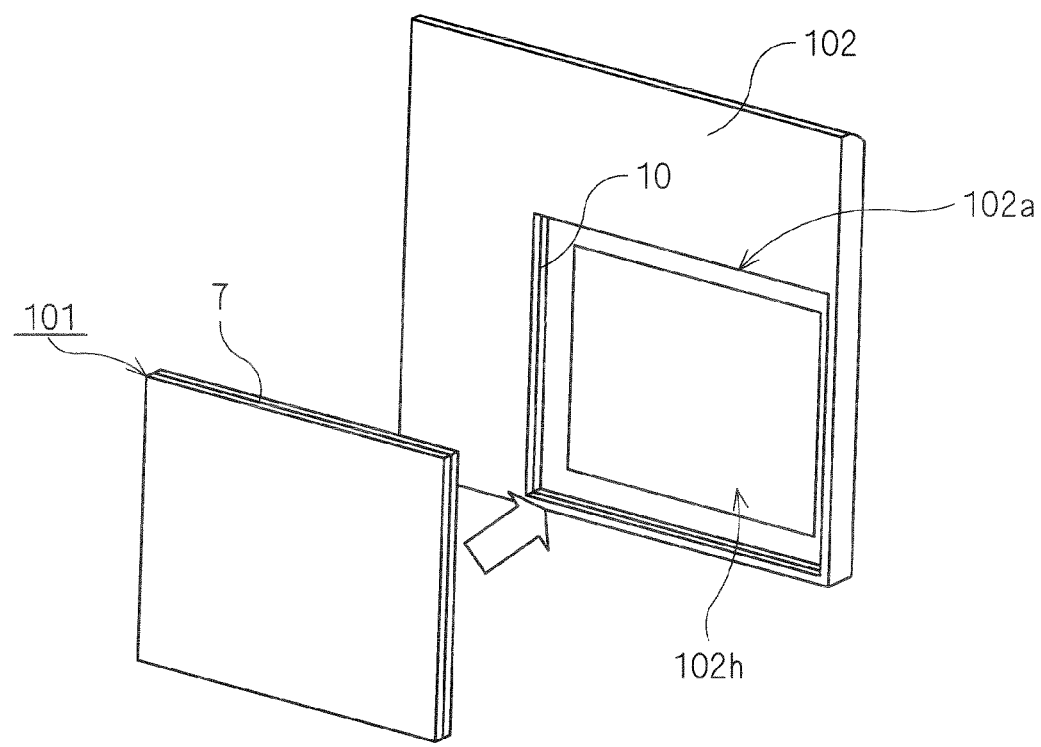
FIG. 5 is a perspective view of the display device and the housing seen from a back face side of the housing.

FIGS. 4 and 5 are exploded perspective views of the preferred embodiment of the present invention. FIG. 4 is a perspective view of the display device 101 and the housing 102 seen from the front face side of the housing 102. FIG. 5 is a perspective view of the display device 101 and the housing 102 seen from the back face side of the housing 102.

As shown in FIGS. 4 and 5, a recessed portion 102a to which the display device 101 is mounted is formed in the housing 102. The recessed portion 102a has a predetermined-shaped space in which the display device 101 is mounted. The predetermined shape corresponds to an outer shape of the display device 101. That is, the predetermined shape is a flat plate shape corresponding to an outline of the display device 101. In other words, the housing 102 has the predetermined-shaped space. As described above, since the display device 101 has the flat shape, the predetermined shape is the flat plate shape corresponding to the outline of the display device 101.

If the display device 101 has a shape other than the plate shape, the predetermined shape is the shape other than the plate shape so that the display device 101 can be mounted.

As shown in FIGS. 4 and 5, the elastic body 7 is continuously disposed in the recessed portion 9 formed in the peripheral side face of the display device 101. That is, as described above, the elastic body 7 is provided to the side face of the display device 101 in the closed loop shape.

A recessed portion 10 for housing at least a part of the elastic body 7 provided in the recessed portion 9 of the display device 101 is formed in the housing 102. Specifically, the recessed portion 10 for housing a part of the elastic body 7 is disposed at the housing 102 (recessed portion 102a) to which the display device 101 is mounted (fixed).

In the present preferred embodiment, the display device 101 including the planar light source device 100 and the display panel 3, and the housing 102 to which the display device 101 is mounted will be described by using parts (a) to (c) in FIG. 3 described above.

FIG. 3 is a detail view of structures of the display device 101 provided with the elastic body 7 and the housing 102. The elastic body 7 in the present preferred embodiment is disposed on an outer side of the peripheral side face perpendicular to the display surface 100n of the display device 101.

In the present preferred embodiment, the peripheral side face perpendicular to the display surface 100n is the side face 8a of the front frame 8 as described above. In the side face 8a of the front frame 8 (the side face of the display device 101), the recessed portion 9 corresponding to the shape of the elastic body 7 is formed. The elastic body 7 is disposed in the position corresponding to the recessed portion 9.

The sectional shape of the elastic body 7 is a circle or a polygon. The elastic body 7 is elastically deformed to thereby be fitted into the recessed portion 9 in the side face 8a of the display device 101 (front frame 8).

Next, mounting of the display device 101 to the housing 102 will be described in detail.

Figure 6:
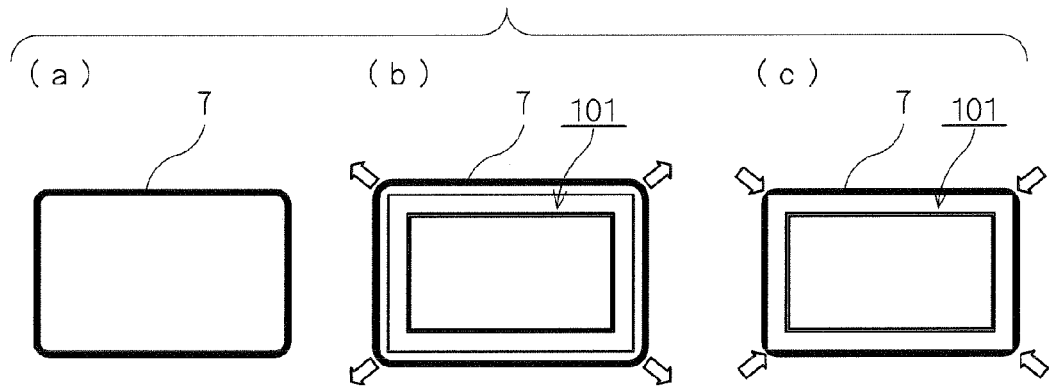
FIG. 6 is a view showing a manner of elastic deformation of an elastic body.

FIG. 6 is a view showing the manner of elastic deformation of the elastic body 7. As shown in part (a) in FIG. 6, the size of the elastic body 7 is smaller than the size of the outer shape of the display device 101. As shown in part (b) in FIG. 6, the elastic body 7 is elastically deformed to be larger than the outer shape of the display device 101 by a tensile load applied to the elastic body 7.

Then, the load is removed so that a part of the elastic body 7 is housed in the recessed portion 9 formed in the peripheral side face of the display device 101. Then, as shown in part (c) in FIG. 6, a part of the elastic body 7 is housed in the recessed portion 9 in the side face of the display device 101 due to resilience of the elastic body 7. As described above, a part of the elastic body 7 is exposed from the recessed portion 9.

Due to elastic deformation of the part of the elastic body 7 exposed from the recessed portion 9 formed in the peripheral side face of the display device 101, the exposed part of the elastic body 7 is housed in the recessed portion 10 provided to the housing 102. That is, when the display device 101 is mounted in the predetermined-shaped space of the recessed portion 102a of the housing 102, the elastic body 7 is elastically deformed. In this manner, the display device 101 can be mounted (fixed) to the housing 102 without use of screws or metal springs. The above-described structure does not increase the number of members for mounting the display device 101 to the housing 102. The members are cushion, double-faced adhesive tape, and the like.

Figure 7:
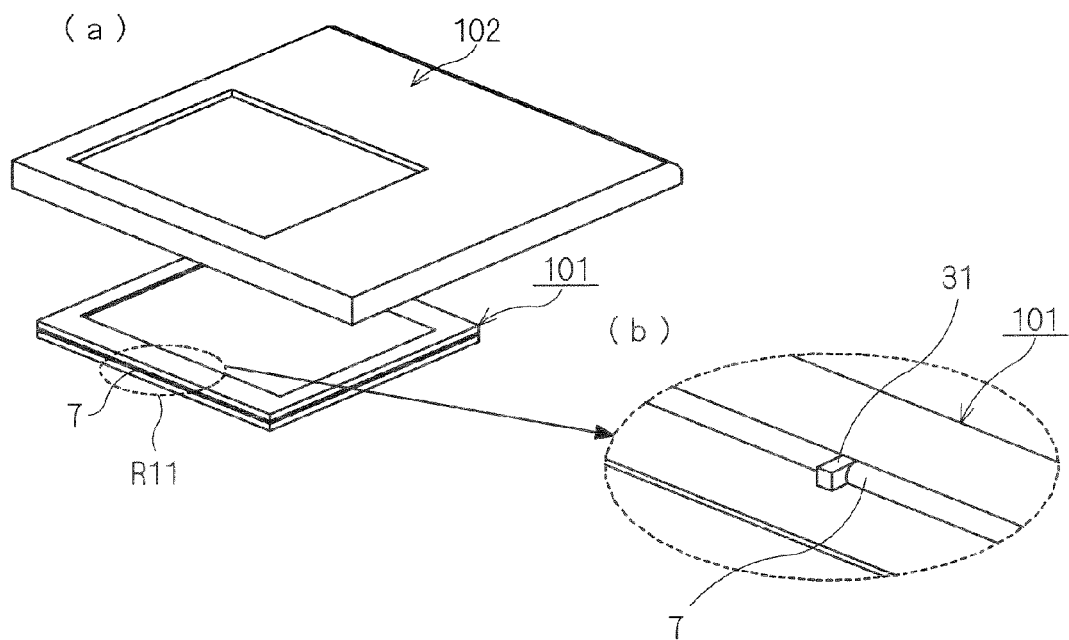
FIG. 7 is a perspective view of the display device and the housing seen from the front face side of the housing.
Figure 8:
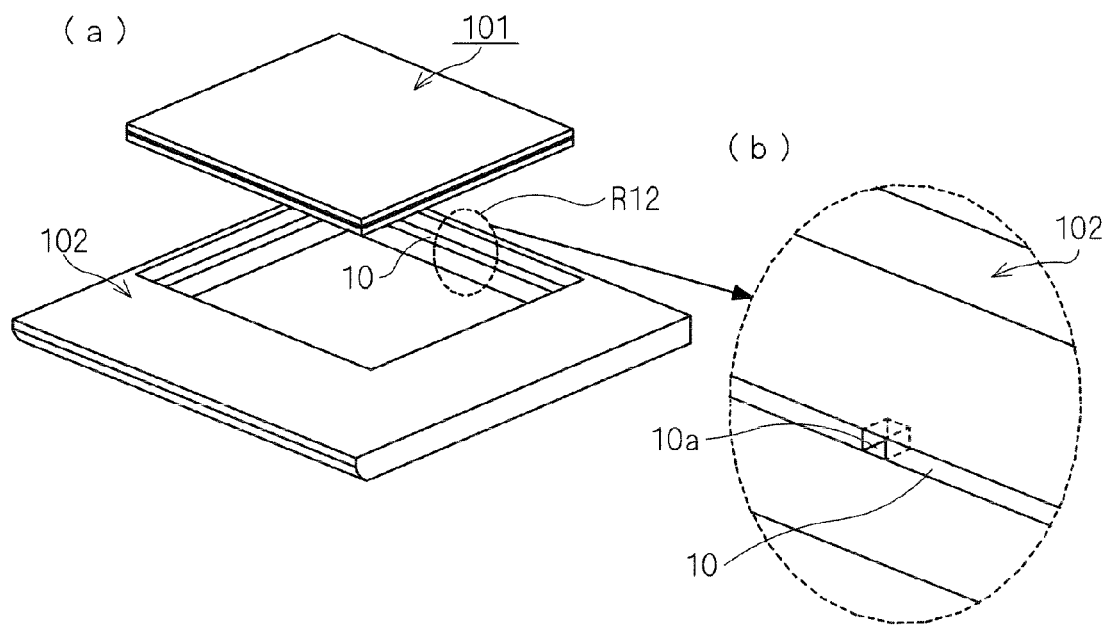
FIG. 8 is a perspective view of the display device and the housing seen from the back face side of the housing.

As shown in FIG. 7 and FIG. 8, the part of the elastic body 7 disposed in the side face of the display device 101 may be changed in shape so as to carry out positioning of the display device 101 and the housing 102 with respect to each other.

Part (a) in FIG. 7 is a perspective view of the display device 101 and the housing 102 seen from the front face side of the housing. Part (b) in FIG. 7 is an enlarged view of an area R11 in part (a) in FIG. 7. Part (a) in FIG. 8 is a perspective view of the display device 101 and the housing 102 seen from the back face side of the housing 102. Part (b) in FIG. 8 is an enlarged view of an area R12 in part (a) in FIG. 8.

For example, as shown in part (b) in FIG. 7, a protruding portion 31 is formed at a portion of the elastic body 7 in contact with the housing 102. The protruding portion 31 is formed to protrude toward the housing 102 to which the display device 101 is mounted.

As shown in FIG. 8, a recessed portion 10a is provided to the housing 102. Specifically, the recessed portion 10a to be fitted over the protruding portion 31 provided to the elastic body 7 is formed in the recessed portion 10 of the housing 102. As described above, the protruding portion 31 to be fitted into the recessed portion 10a of the housing 102 is provided to the elastic body 7.

When the display device 101 is mounted to the housing 102, the protruding portion 31 is fitted into the recessed portion 10a provided to the housing 102. Because the protruding portion 31 of the elastic body 7 and the recessed portion 10a of the housing 102 are fitted with each other, positioning of the display device 101 when the display device 101 is mounted to the housing 102 can be carried out.

Figure 9:
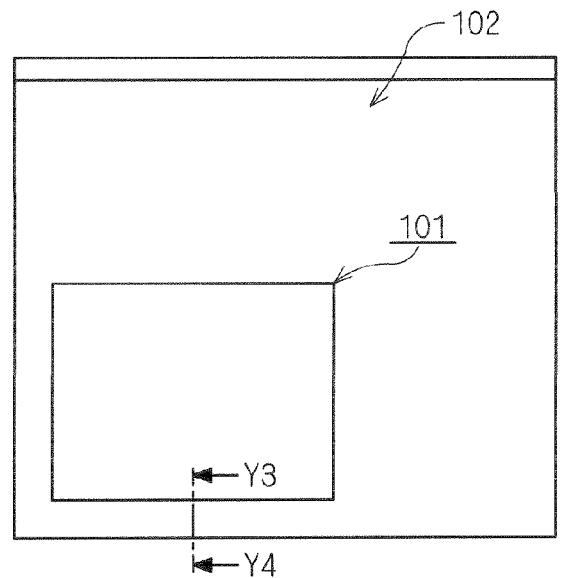
FIG. 9 is a plan view of the housing in which the display device is mounted.
Figure 10:
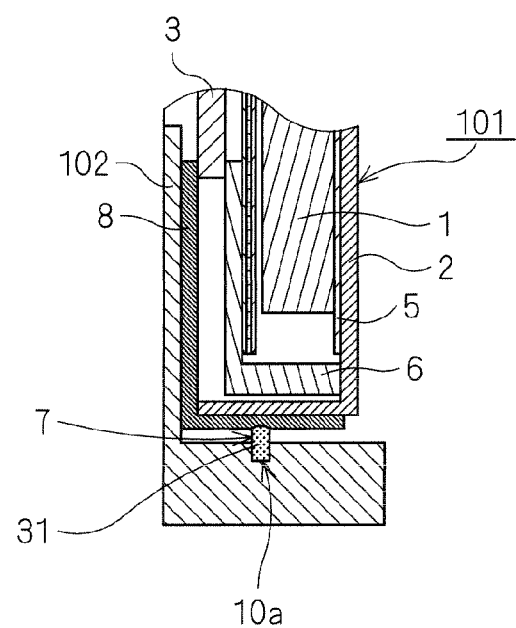
FIG. 10 is a sectional view of the display device and the housing.

FIG. 9 is a plan view of the housing 102 to which the display device 101 is mounted. FIG. 10 is a sectional view of the display device 101 and the housing 102 taken along line Y3-Y4 in FIG. 9. FIG. 10 is a sectional view of the protruding portion 31 provided to the elastic body 7 and the deeper recessed portion 10a provided to the housing 102.

Because the protruding portion 31 of the elastic body 7 is fitted into the recessed portion 10a provided to the housing 102, the positioning of the display device 101 when the display device 101 is mounted to the housing 102 can be carried out.

Figure 11:
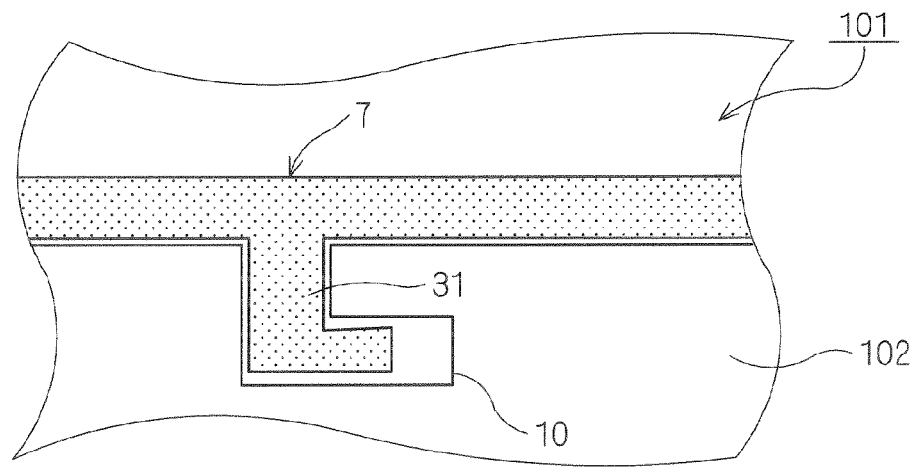
FIG. 11 is a view showing an example of a shape of a protruding portion.

A shape of the protruding portion 31 provided to the elastic body 7 is not restricted to the shape shown in part (b) in FIG. 7. For example, as shown in FIG. 11, the protruding portion 31 may have a hook shape. That is, a hook-shaped protruding portion 31 may be provided to a portion of the elastic body 7. In this case, the recessed portion 10 provided to the housing 102 has such a shape as to be able to house the hook-shaped protruding portion 31. In this structure, the hook-shaped protruding portion 31 is fitted in the recessed portion 10 of the housing 102. In this way, positioning of the display device 101 and the elastic body 7 with respect to each other can be carried out, and also the display device 101 and the housing 102 are joined to each other more firmly.

One or a plurality of protruding portions may be provided at the portion of the elastic body 7 in contact with the housing 102. The number of protruding portions to be provided may be selected suitably and freely in consideration of ease of assembly. Similarly, the positioning can be carried out on the display device 101 side (not shown).

As described above, the recessed portion 9 is formed in the side face of the display device 101 according to the present preferred embodiment. The elastic body 7 is provided to the recessed portion 9. The elastic body 7 is elastically deformed to thereby fix the display device 101 to the housing 102 when the display device 101 is mounted in the predetermined-shaped space of the housing 102.

In this way, with the simple structure using the elastic body 7, it is possible to mount the display device 101 to the housing 102. As a result, it is possible to mount the display device 101 to the housing 102 at low cost.

In other words, the display device 101 in the present preferred embodiment has the elastic body 7 for mounting (fixing) the display device 101 to the housing 102. By interposing the elastic body 7 between the display device 101 and the housing 102, the display device 101 is mounted (fixed) to the housing 102.

In this way, screw insertion portions for fixing by screws or areas for retaining by holding become unnecessary. That is, it is unnecessary to provide to the display device 101 the screw insertion portions for fastening the display device 101 to the housing 102. As a result, it is possible to reduce a length of a frame of the display device 101 and a thickness of the display device 101. Therefore, the frame of the display device 101 can be narrowed and the display device 101 can be thinned. That is, with the display device 101 according to the present preferred embodiment, it is possible to solve the problem of increase in the size of the frame and the thickness due to the portion to be mounted to the housing 102.

As shown in FIG. 5, in mounting the display device 101 to the housing 102, the display device 101 is pushed into the recessed portion 102a (the predetermined-shaped space) provided to the housing 102 from the back face side of the housing 102. As a result, the display device 101 is mounted (fixed) to the housing 102. Therefore, a tool and a step for fastening the screws are unnecessary, which improves operability.

With the above-described structure, unlike the related art, a space behind the display device 101 for holding with metal flat springs, screws, or the like is unnecessary for mounting (fixing) the display device 101 to the housing 102. That is, a structure for holding the display device 101 from behind is unnecessary. Therefore, in disposing the circuit members and the like on the back face of the plate-shaped display device 101, an area where circuit members and the like can be disposed is not restricted. That is, it is possible to remove the restriction in disposing the circuit board on the back face of the display device 101.

If the fixing is carried out by using screws or by holding the housing, a mounting step requires certain time. If repair is necessary, a detachment step also requires time. In the present preferred embodiment, with the above-described structure, mounting (fixing) and detachment of the display device 101 to and from the housing are easy. Therefore, time required to mount (fix) the display device 101 to the housing 102 and time required for a detachment step for the repair can be shortened. As a result, with the display device 101 according to the present preferred embodiment, it is possible to reduce the cost.

In the present preferred embodiment, the elastic body is disposed in the peripheral side face of the display device 101. In this way, it is possible to enhance shock resistance when the display device 101 is mounted (fixed) to the housing 102.

Moreover, the display device 101 is mounted (fixed) to the housing 102 by means of elastic deformation of the elastic body 7. Therefore, addition of shock-absorbing material such as cushion and a member for mounting such as double-faced adhesive tape is unnecessary. Even if detachment of the display device 101 is necessary, the elastic body 7 can be used repeatedly.

As described above, the sectional shape of the elastic body 7 is circle or polygon. The sectional shape of the elastic body 7 can be selected suitably and freely according to the shape of the recessed portion 10 of the housing 102.

For example, as shown in FIG. 12, taper 10T may be provided to a bottom of the recessed portion 10. In this case, taper to make contact with the taper 10T is provided to the elastic body 7. This structure facilitates mounting to the housing.

As shown in each of parts (a) to (c) in FIG. 13, the sectional shape of the elastic body 7 may be a polygon with multiple steps. This structure enhances the shock resistance.

At a periphery of the display device 101, a space may be provided partially between the elastic body 7 and the display device 101. In this structure, by inserting a tool into the space, it is possible to easily detach the elastic body from the display device 101. This structure facilitates detachment of the display device 101 mounted (fixed) to the housing 102. By applying stress to the elastic body 7, the elastic body 7 is elastically deformed and the display device 101 is detached from the housing 102.

In order to further facilitate mounting of the display device 101 using the elastic body 7, the recessed portion 10 provided to the housing 102 may have such a shape that side faces of the recessed portion 10 in contact with the elastic body 7 are inclined from the opening portion 2a of the housing 102 toward the display surface 100n.

A protruding portion may be partially disposed in the recessed portion 10 of the housing 102. In this way, it is possible to further reliably fix (mount) the display device to the housing 102.

Figure 14:
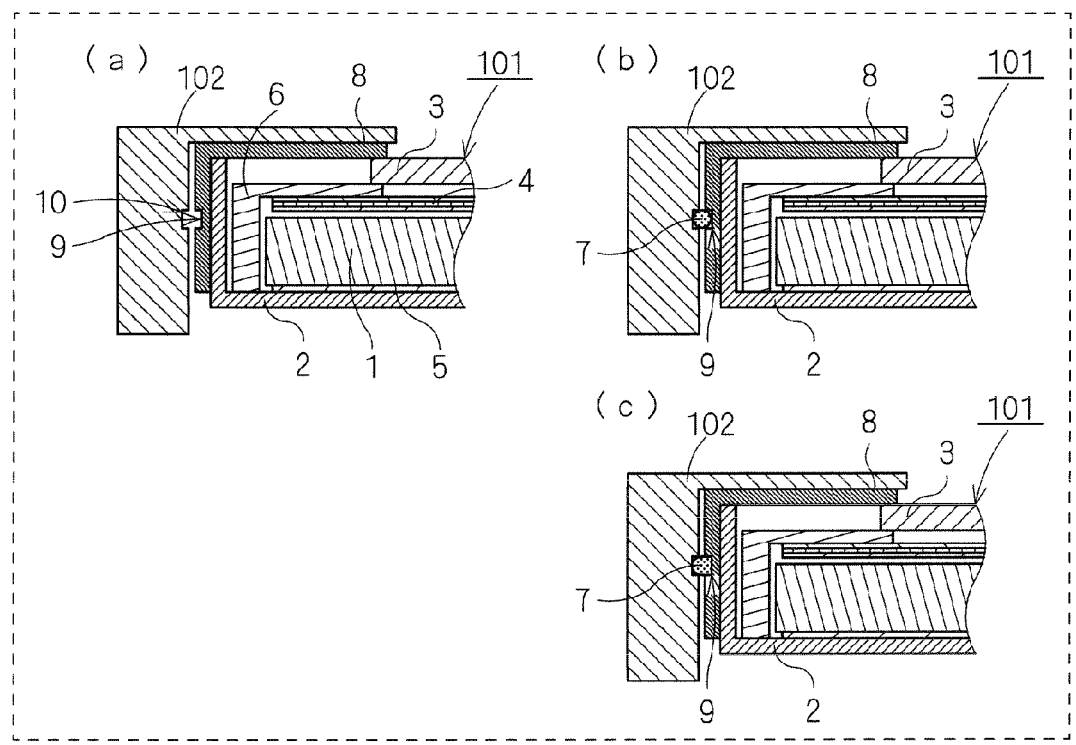
FIG. 14 is a view for describing the sectional shape of the elastic body.

The sectional shape of the elastic body 7 is not restricted to circle and may be as follows. FIG. 14 is a view for describing sectional shapes of the elastic body 7. Parts (a) to (c) in FIG. 14 are sectional views of the display device 101 and the housing 102 similar to those in part (b) in FIG. 3. Part (a) in FIG. 14 does not show the elastic body 7 so as to facilitate visualization of the drawing. Part (b) in FIG. 14 shows a state in which the sectional shape of the elastic body 7 is circle.

Part (c) in FIG. 14 shows a state in which the sectional shape of the elastic body 7 is a shape other than the circle. As described above, the bottom of the recessed portion 9 is a flat face. The elastic body 7 is provided to make contact with the bottom of the elastic body 7.

Specifically, as shown in part (c) in FIG. 14, a face of the elastic body 7 to be in contact with the bottom face of the recessed portion 9 of the display device 101 may be a flat face. That is, a portion of the elastic body 7 to be in contact with the bottom of the recessed portion 9 may be the flat face.

In this case, as compared with the elastic body 7 having the circular sectional shape as shown in part (b) in FIG. 14, it is possible to restrain movement of the elastic body 7 in mounting the display device 101 to the housing 102. As a result, positional displacement of the display device 101 can be prevented.

Adhesive material may be disposed on the flat face of the elastic body 7 in part (c) in FIG. 14. In this way, the elastic body 7 is fixed more firmly.

At the periphery of the display device 101, a notch into which a tool is to be inserted to detach the display device 101 from the housing 102 is formed.

On the back face of the housing 102, a protrusion may be provided to an edge of the recessed portion 102a into which the display device 101 is to be mounted. This structure prevents the display device 101 from moving toward the back face side of the housing 102 even when stress is applied from the display surface 100n side of the display device 101. The similar effect can be obtained by a structure in which a case on the back face of the housing 102 supports the display device 101.

Second Preferred Embodiment

In the present preferred embodiment, a display device having a structure for fixing a planar light source device will be described.

Figure 15:
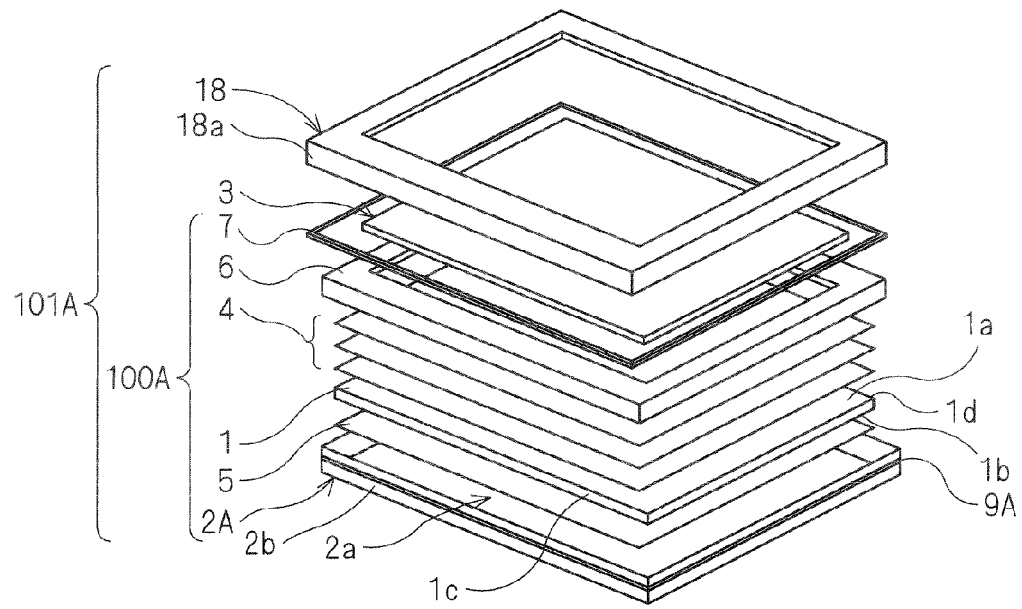
FIG. 15 is an exploded perspective view of a display device according to a second preferred embodiment of the present invention.
Figure 16:
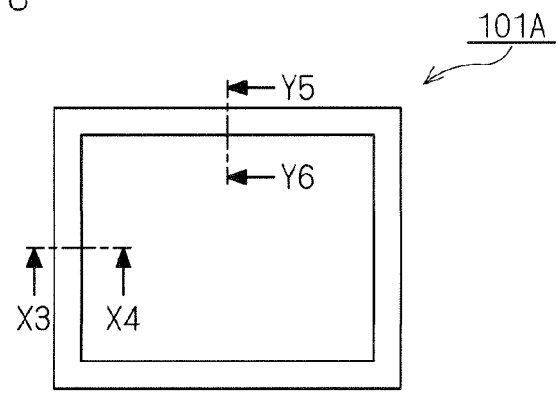
FIG. 16 is a plan view of the display device according to the second preferred embodiment of the present invention.
Figure 17:
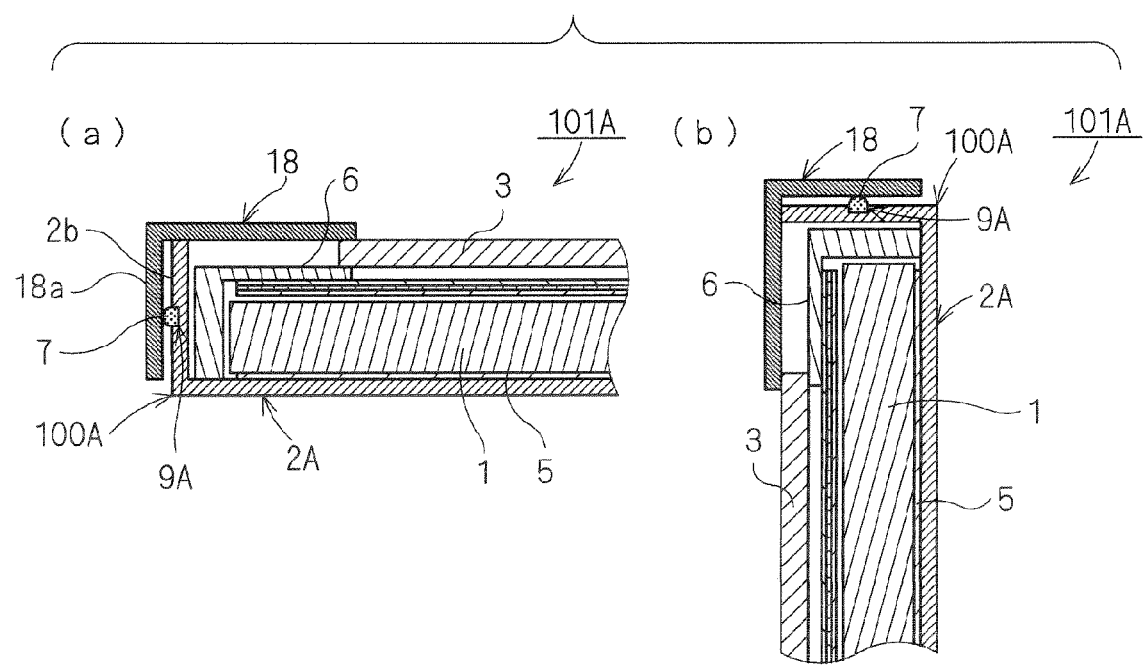
FIG. 17 is a sectional view of the display device according to the second preferred embodiment of the present invention.

FIG. 15 is an exploded perspective view of a display device 101A according to a second preferred embodiment of the present invention. FIG. 16 is a plan view of the display device 101A according to the second preferred embodiment of the present invention. FIG. 17 is a sectional view of the display device 101A according to the second preferred embodiment of the present invention. Part (a) in FIG. 17 is a sectional view of the display device 101A taken along line X3-X4 in FIG. 16. Part (b) in FIG. 17 is a sectional view of the display device 101A taken along line Y5-Y6 in FIG. 16.

As shown in FIG. 15, the display device 101A is different from the display device 101 in FIG. 2 in that a front frame 18 and a planar light source device 100A are provided in place of the front frame 8 and the planar light source device 100. Other structures of the display device 101A are similar to those of the display device 101, and therefore will not be specifically described again. That is, the display device 101A includes a display panel 3 placed on the planar light source device 100A.

A shape of the display device 101A is similar to the shape (plate shape) of the display device 101.

The front frame 18 is different from the front frame 8 in FIG. 2 in that it does not have the recessed portion 9. Other structures of the front frame 18 are similar to those of the front frame 8, and therefore will not be specifically described again.

The planar light source device 100A is different from the planar light source device 100 in FIG. 2 in that it includes an elastic body 7 and that it includes a rear frame 2A in place of the rear frame 2. Other structures of the planar light source device 100A are similar to those of the planar light source device 100, and therefore will not be specifically described again.

With reference to FIG. 15 and parts (a) and (b) in FIG. 17, a side face of the planar light source device 100A is a side face 2b of the rear frame 2A. A recessed portion 9A is formed in the side face of the planar light source device 100A.

The rear frame 2A is provided with the recessed portion 9A formed in the side face of the rear frame 2. The recessed portion 9A has the same shape as the above-described recessed portion 9. The recessed portion 9A is recessed toward an inside of the display device 101A. A part of the elastic body 7 is housed in the recessed portion 9A. That is, the elastic body 7 is provided in the recessed portion 9A. A part of the elastic body 7 is exposed from the recessed portion 9A.

In the display device 101A, the display panel 3 is held between the planar light source device 100A and the front frame 18. The front frame 18 comes in contact with the elastic body 7 provided in the recessed portion 9A to thereby elastically deform the elastic body 7 to fix the planar light source device 100A. Similarly to the front frame 8, the front frame 18 holds the display panel 3 placed on the planar light source device 100A and forms a side face of the display device 101A.

In the display device 101A having the above-described structure, the elastic deformation of the elastic body 7 causes stress on the planar light source device 100A and the front frame 18 to thereby fix the planar light source device 100A.

The front frame 18 of the display device 101A may be replaced by the front frame 8 provided with the elastic body 7 described in the first preferred embodiment. In the following description, the display device 101A in which the front frame 18 is replaced by the front frame 8 provided with the elastic body 7 will be referred to as a "display device X".

In addition to the elastic body 7 provided to the side face of the display device X (front frame 8), the display device X further includes another elastic body 7 provided to the side face of the planar light source device 100A. The front frame 8 of the display device X holds the display panel 3 placed on the planar light source device 100A to thereby form the side face of the display device X.

When the display device X having the above-described structure is mounted in a predetermined-shaped space of the housing 102, the elastic body 7 on the side face of the display device X is elastically deformed to thereby fix the display device X to the housing 102.

The display device X having the above-described structure exerts similar effects to the first preferred embodiment. That is, with the simple structure utilizing the elastic body 7, it is possible to mount the display device X to the housing 102. As a result, it is possible to mount the display device X to the housing 102 at low cost.

Third Preferred Embodiment

Figure 18:
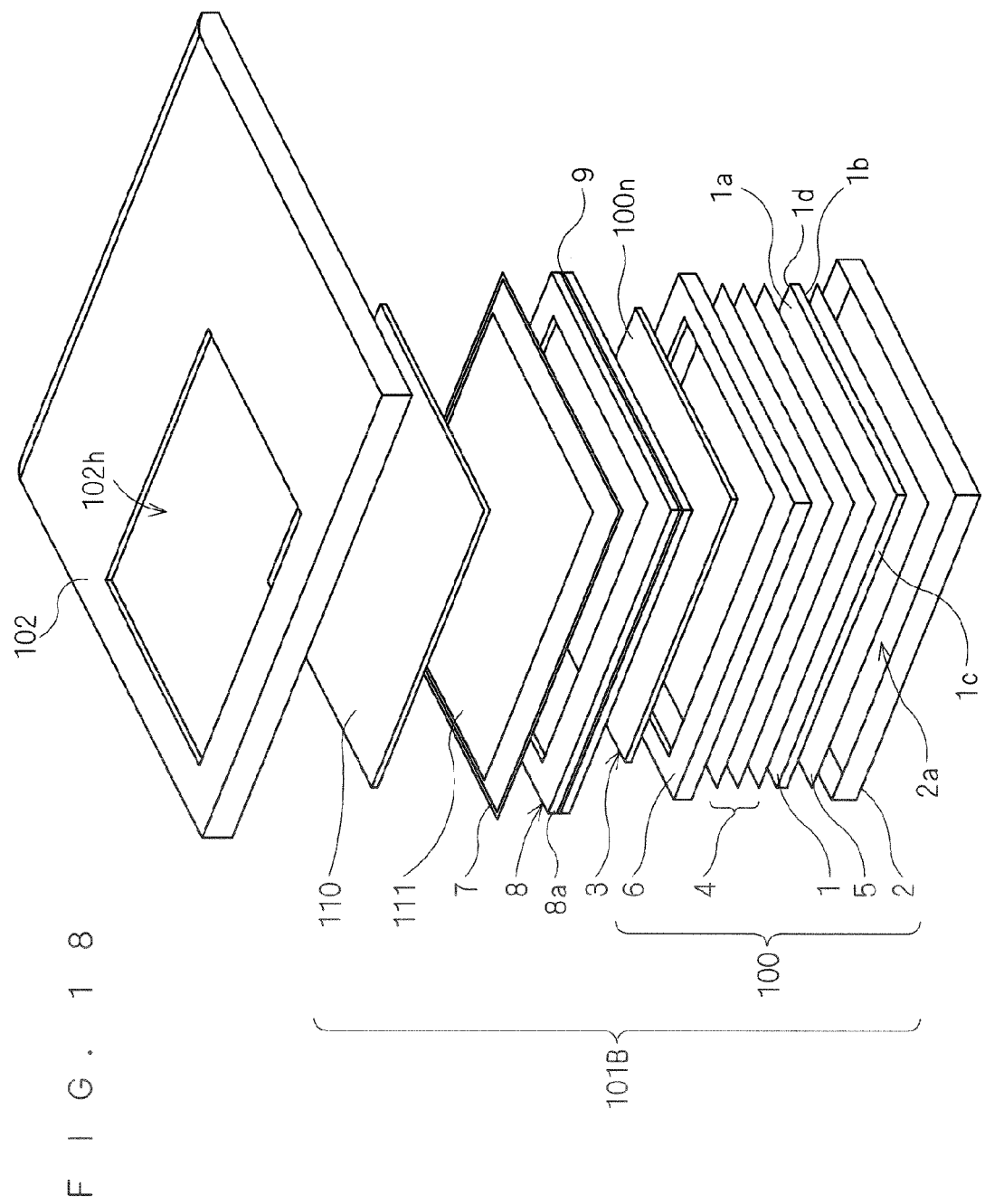
FIG. 18 is an exploded perspective view of a display device and a housing according to a third preferred embodiment of the present invention.
Figure 19:
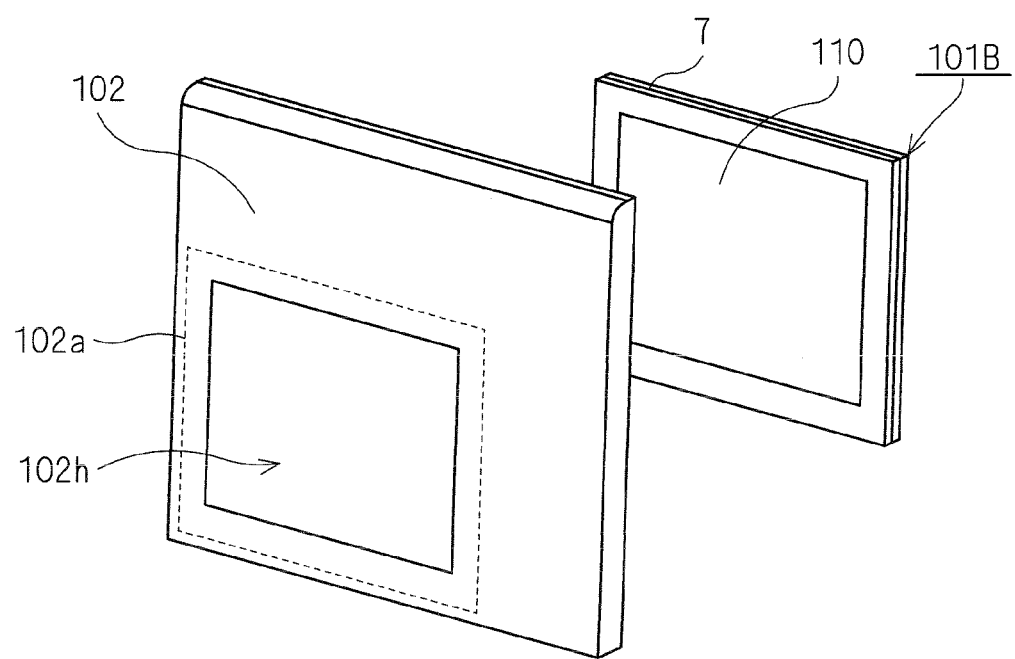
FIG. 19 is a perspective view of the display device and the housing according to the third preferred embodiment of the present invention.

In the present preferred embodiment, a display device having a structure in which a protecting plate is provided to a display surface will be described. FIG. 18 is an exploded perspective view of a display device 101B and a housing 102 according to a third preferred embodiment of the present invention. FIG. 19 is a perspective view of the display device 101B and the housing 102 according to the third preferred embodiment of the present invention.

Figure 20:
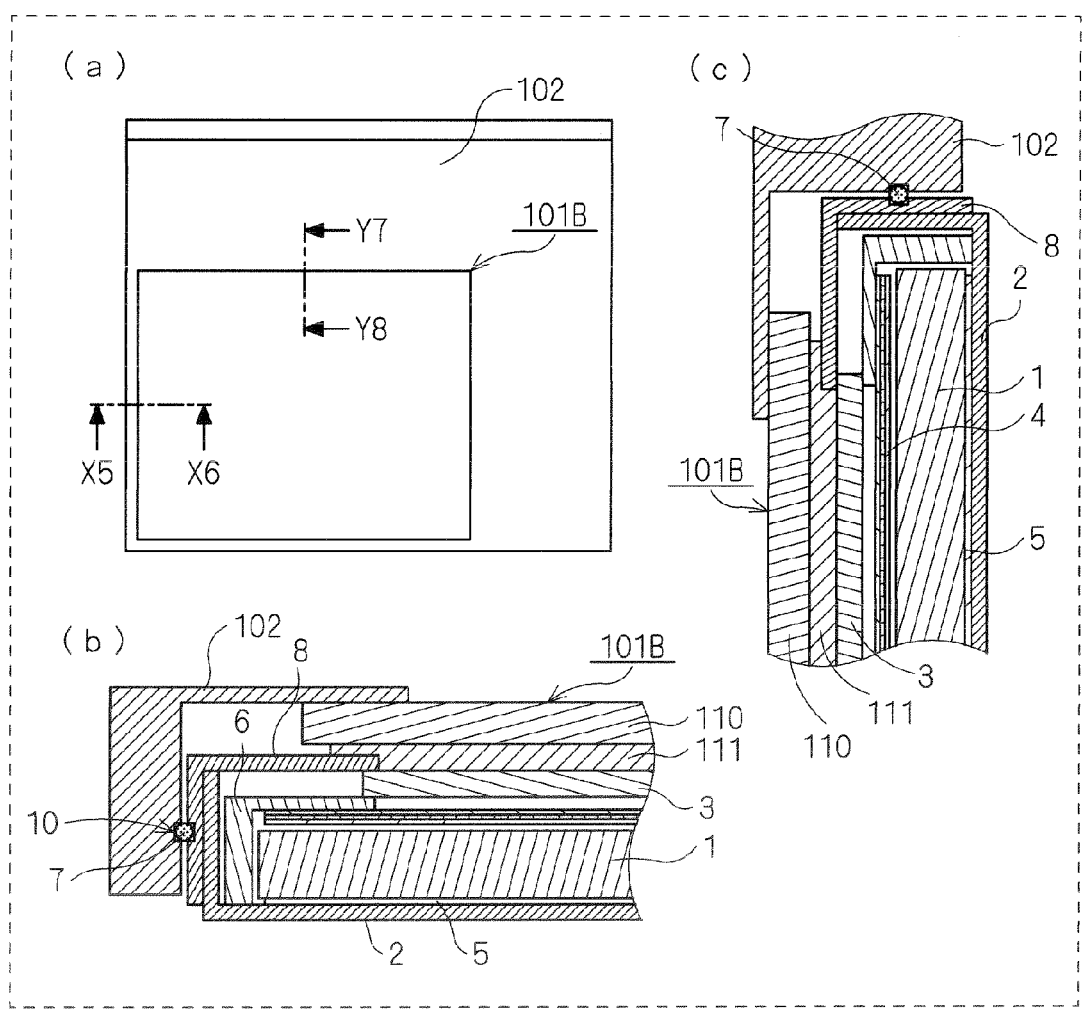
FIG. 20 is a detail view of the display device and the housing according to the third preferred embodiment of the present invention.

FIG. 20 is a detail view of structures of the display device 101B and the housing 102 according to the third preferred embodiment of the present invention. Part (a) in FIG. 20 is a plan view of the display device 101B and the housing 102. Part (b) in FIG. 20 is a sectional view of the display device 101B and the housing 102 taken along line X5-X6 in part (a) in FIG. 20. Part (c) in FIG. 20 is a sectional view of the display device 101B and the housing 102 taken along line Y7-Y8 in part (a) in FIG. 20.

As shown in FIG. 18, the display device 101B is different from the display device 101 in FIG. 2 in that it further includes a protecting plate 110. Other structures of the display device 101B are the same as those of the display device 101 and therefore will not be specifically described again.

The protecting plate 110 is formed by a transparent member such as glass, for example. The protecting plate 110 is not restricted to glass and may be made of resin material, for example.

With reference to FIG. 18 and FIG. 20, the protecting plate 110 is provided to cover a display surface 100n of a display panel 3. Specifically, the protecting plate 110 is provided in front of the display surface 100n. The protecting plate 110 is fixed to the display surface 100n of the display panel 3 by using adhesive material 111. The adhesive material 111 is double-faced adhesive tape, adhesive, or the like, for example. Metal such as a front frame 8 is sandwiched between the display panel 3 and the protecting plate 110.

If the protecting plate 110 is made of resin material, depending on the size of the protecting plate 110, the metal (e.g., the front frame 8) is not provided between the protecting plate 110 and the display surface 100n (display panel 3) as in the display device 101A in the second preferred embodiment. In this case, as in the second preferred embodiment, a recessed portion may be provided to a rear frame of a planar light source device and an elastic body 7 may be provided in the recessed portion. That is, the protecting plate 110 provided to cover the display surface 100n may be applied to the display device 101A in the second preferred embodiment. That is, in the display device 101A, the protecting plate 110 may be provided to cover the display surface 100n.

With reference to parts (b) and (c) in FIG. 20, an elastic body 7 disposed in a peripheral side face perpendicular to the display surface 100n of the display panel 3 is elastically deformed and disposed in a recessed portion 10 in a housing 102. With this structure, sealing is provided between the display device 101B and the housing 102.

In the display device 101B according to the present preferred embodiment, the protecting plate 110 is provided in front of the display surface 100n. Therefore, it is possible to prevent liquid such as water from entering the housing 102 from the front of the display surface 100n.

The present preferred embodiment exerts similar effects to the first preferred embodiment. That is, with the simple structure utilizing the elastic body 7, it is possible to mount the display device 101B to the housing 102. As a result, it is possible to mount the display device 101B to the housing 102 at low cost.

Although the single elastic body 7 is used in the first to third preferred embodiments, two or more elastic bodies 7 may be used. With this structure, resistance to water immersion doubles and therefore, it is possible to further enhance waterproof performance.

In disposing the elastic body 7, it may be attached to the planar light source device (display device) by using adhesive material as necessary.

Although the elastic body is disposed on the display device in the first to third preferred embodiments, the present invention is not restricted thereto. The elastic body may be disposed on the housing 102. In this case, the elastic body may be attached to the recessed portion of the housing 102 by using double-faced adhesive tape.

Only a part of the elastic body may be attached to the planar light source device (display device) or the housing.

Color of the elastic body 7 provided to the display device according to each of the first to third preferred embodiments is not particularly specified. In order to suppress transmitted light through a gap between the housing and the display device, the elastic body may be black.

The present invention is not restricted to the structures of the above-described preferred embodiments but may be changed and combined with each other in various ways without departing from the scope of the present invention. That is, in the present invention, the preferred embodiments can be combined freely and suitably with each other and modified or omitted within the scope of the present invention.

For example, the elastic body 7 may not be continuous at the periphery of the planar light source device and end portions of the elastic body 7 may be fixed to the display device or the housing. Moreover, kinds and disposed positions of the light source and the light guide plate are not restricted to those in the structures in the above-described preferred embodiments and may be changed suitably.

The structure provided with the protecting plate 110 in the third preferred embodiment may be applied to the display device 101 in the first preferred embodiment and the display device 101A and the display device X in the second preferred embodiment.

The structure provided with the protruding portion 31 and the recessed portion 10a in the first preferred embodiment may be applied to the display device and the housing according to the second or the third preferred embodiment.

The shape of the elastic body 7 described with reference to part (c) in FIG. 14 in the first preferred embodiment may be applied to the display device according to the second or the third preferred embodiment.

The present invention can be utilized as the display device which can be mounted to the housing at low cost.

While the invention has been shown and described in detail, the foregoing description is in all aspects illustrative and not restrictive. It is therefore understood that numerous modifications and variations can be devised without departing from the scope of the invention.

What is claimed is:

1. A display device mounted in a predetermined-shaped space of a housing, wherein
    a recessed portion is formed in a side face of said display device,
    an elastic body is provided in said recessed portion, and
    said elastic body is elastically deformed to fix said display device to said housing when said display device is mounted in said space of said housing,
    the display device comprising
    a planar light source device and
    a display panel placed on said planar light source device, wherein
    another recessed portion is formed in a side face of said planar light source device,
    another elastic body is provided in said another recessed portion, and
    said display device further includes a front frame for holding said display panel placed on said planar light source device, forming a side face of said display device, and coming into contact with said another elastic body provided in said another recessed portion to thereby elastically deform said another elastic body to fix said planar light source device.

2. The display device according to claim 1, wherein
    said predetermined-shaped space is a flat plate shape corresponding to an outline of said display device.

3. The display device according to claim 1, wherein
    said display panel includes a display surface for displaying a video image and
    said display device further includes a protecting plate provided to cover said display surface.

4. The display device according to claim 1, wherein
a bottom of said recessed portion is a flat face,
said elastic body is provided to make contact with the bottom of said recessed portion, and
a portion of said elastic body making contact with the bottom of said recessed portion is a flat face.

5. The display device according to claim 1, wherein
said elastic body is provided with a protruding portion, and
said protruding portion is fitted with a recessed portion provided to said housing.

6. The display device according to claim 1, wherein
said housing is provided with another recessed portion for housing at least a part of said elastic body provided in said recessed portion of said display device.

* * * * *